(12) United States Patent  (10) Patent No.: US 7,804,911 B2
Meltzer et al.  (45) Date of Patent: Sep. 28, 2010

(54) DUAL DEMODULATION MODE AM RADIO

(75) Inventors: David Meltzer, Wappinger Falls, NY (US); Gregory A. Blum, Lagrangeville, NY (US); Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 738 days.

(21) Appl. No.: 11/740,159

(22) Filed: Apr. 25, 2007

(65) Prior Publication Data

US 2008/0267313 A1 Oct. 30, 2008

(51) Int. Cl.
*H04L 27/02* (2006.01)
(52) U.S. Cl. ..................................................... 375/268
(58) Field of Classification Search ................. 375/268, 375/316, 260, 320, 345; 455/182.1, 232, 455/313, 323; 330/255
See application file for complete search history.

(56) References Cited

U.S. PATENT DOCUMENTS

| | | | |
|---|---|---|---|
| 4,339,728 A | 7/1982 | Monticelli |
| 4,408,351 A | 10/1983 | Maurer et al. |
| 4,455,681 A | 6/1984 | Wile |
| 4,479,266 A | 10/1984 | Eumurian et al. |
| 4,516,248 A | 5/1985 | Barclay et al. |
| 4,626,629 A | 12/1986 | Premoli et al. |
| 4,634,997 A | 1/1987 | Thompsett et al. |
| 4,653,117 A | 3/1987 | Heck |
| 5,471,187 A | 11/1995 | Hansen et al. |
| 5,563,916 A | 10/1996 | Scarpa |
| 5,917,865 A | 6/1999 | Kopmeiners et al. |
| 6,118,499 A | 9/2000 | Fang |
| 6,577,196 B2 | 6/2003 | Hart |
| 6,654,594 B1 | 11/2003 | Hughes et al. |
| 6,668,027 B1 | 12/2003 | Scarpa |
| 6,823,028 B1 | 11/2004 | Phanse |
| 6,862,327 B2 | 3/2005 | Van Sinderen |
| 6,952,182 B2 * | 10/2005 | Spilker et al. ................ 342/464 |
| 6,954,628 B2 | 10/2005 | Minnis et al. |
| 7,024,172 B1 | 4/2006 | Murphy et al. |
| 7,099,688 B2 | 8/2006 | Wilson |
| 7,349,484 B2 * | 3/2008 | Stojanovic et al. .......... 375/260 |
| 2004/0146119 A1 | 7/2004 | Weiner et al. |
| 2005/0146643 A1 | 7/2005 | Lee |
| 2006/0094390 A1 | 5/2006 | Pan et al. |

FOREIGN PATENT DOCUMENTS

| | | |
|---|---|---|
| EP | 0926887 A2 | 6/1999 |
| JP | 4192771 | 7/1992 |
| JP | 2005311657 | 11/2005 |

* cited by examiner

*Primary Examiner*—Khai Tran

(57) ABSTRACT

Apparatuses and methods for receiving an amplitude modulated signal in one of two modes depending on the quality of the received signal. In a first mode, the amplitude modulated signal is converted directly to a baseband signal. In a second mode, the amplitude modulated signal is converted to an intermediate frequency signal. The present invention advantageously combines direct conversion and image-rejection heterodyne receiver topologies with a relatively large degree of component reuse and relatively few additional components.

34 Claims, 10 Drawing Sheets

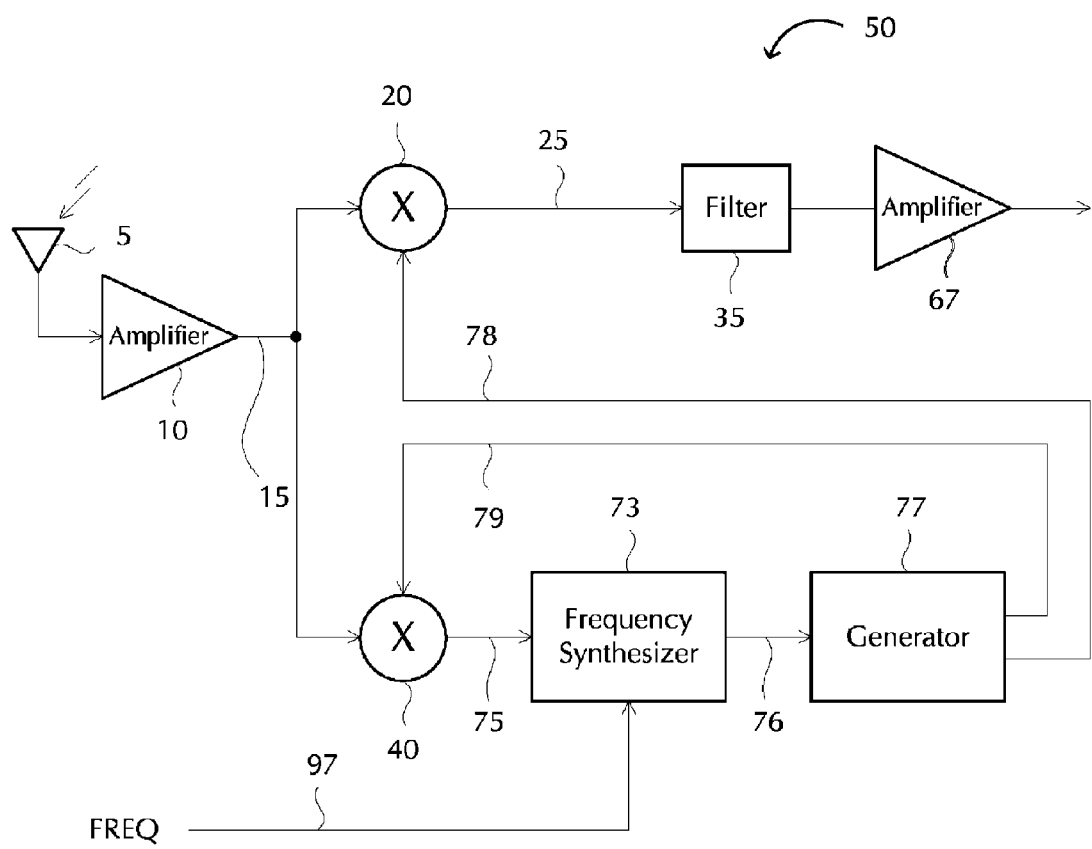
FIG. 1
(Conventional)

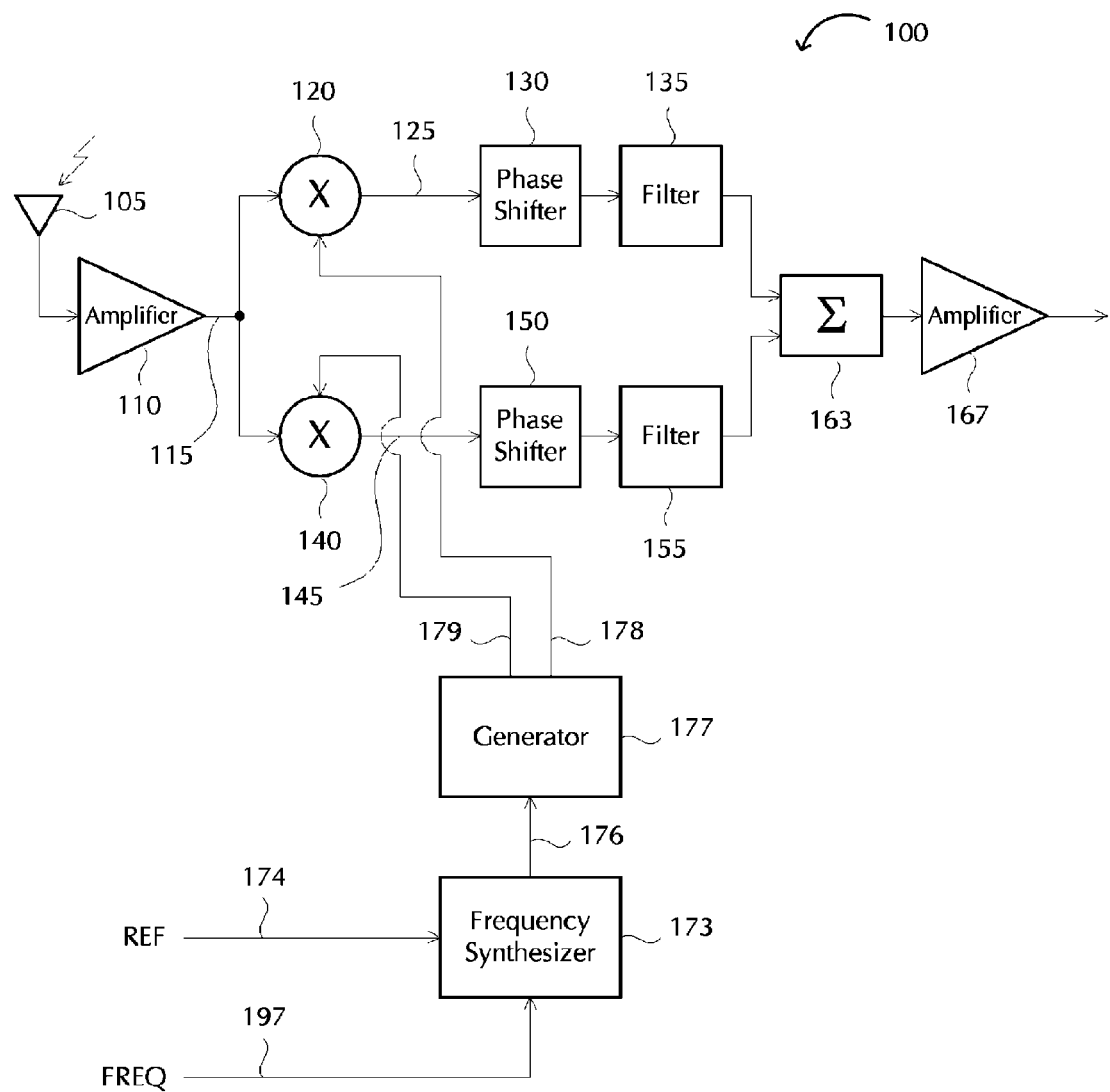
FIG. 2
(Conventional)

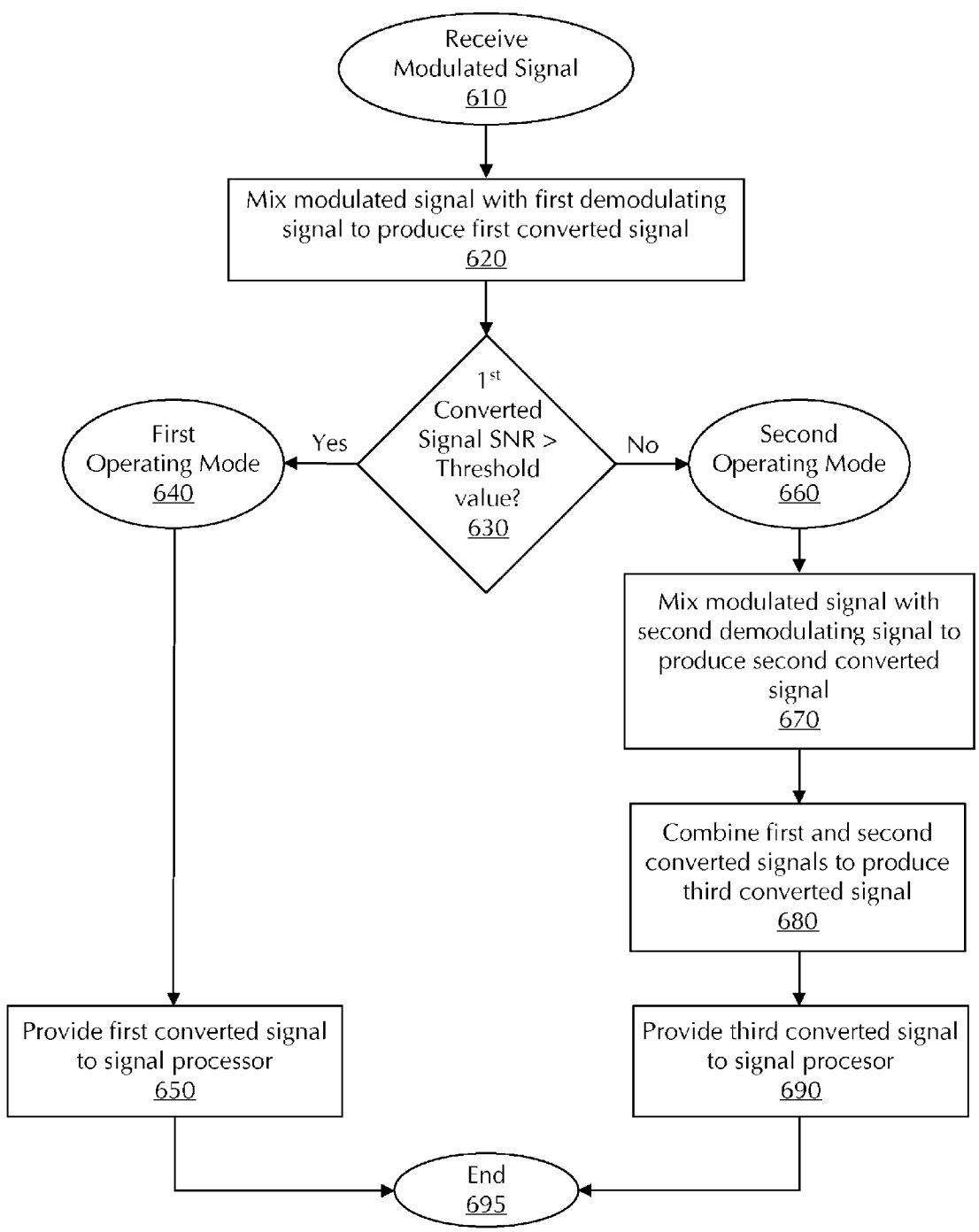

DUAL DEMODULATION MODE AM RADIO

FIELD OF THE INVENTION

The present invention generally relates to the field of AM radio receivers. More specifically, embodiments of the present invention pertain to apparatuses and methods for receiving an amplitude modulated signal in one of two demodulation modes: direct conversion to baseband or image-rejection heterodyne conversion to an intermediate frequency.

DISCUSSION OF THE BACKGROUND

There are several well known techniques for receiving amplitude modulated signals, and in particular, signals modulated by amplitude shift keying a carrier signal. In such AM signals, variations in the magnitude represent digital data, the digital data of which may represent information to be transmitted. Amplitude modulation of digital data is used in a variety of applications including, but not limited to: radio watches, radio frequency identification (RFID) tags, fiber optics, and cable modems.

A first well known technique for receiving amplitude shift keyed modulated signals includes directly converting the AM signal to a baseband signal. FIG. 1 shows a conventional direct conversion receiver 50 suitable for AM demodulation. Antenna 5 is configured to receive a low frequency broadcast radio signal. For radio watch applications, the frequency of the radio signal is typically between 40 kHz to 100 kHz. Amplifier 10 is configured to receive an output from the antenna and generate a modulated signal 15. Modulated signal 15 is then mixed with a first demodulating signal 78 by mixer 20, low pass filtered by filter 35, and amplified by amplifier 67 to produce a baseband signal. This baseband signal can thereafter be converted to a digital signal representative (less errors) of the digital data that was intended to be received.

The first demodulating signal 78 that is mixed with the modulated signal 15 by mixer 20 can be produced by a frequency synthesizer 73 and generator 77. In one example, the modulated signal 15, in addition to being mixed with the first demodulating signal 78 by mixer 20, is additionally mixed with a second demodulating signal 79 by mixer 40. The output of mixer 40 is a phase error signal 75 that is received by a frequency synthesizer 73. The frequency synthesizer 73 also receives a frequency control signal 97 and provides a local carrier signal 76 to a generator 77. In one example, the generator 77 is an I/Q generator and produces an in-phase output and a quadrature phase output. In this example, the in-phase output signal is the first demodulating signal 78 provided to mixer 20 and the quadrature phase output signal is the second demodulating signal 79 provided to mixer 40. The conventional direct conversion receiver 50 of FIG. 1 is most often used in a low noise environment, and may provide better sensitivity to weak broadcast radio signals as compared to other receiver topologies. However, in high noise environments, it may be advantageous to use a more complex approach.

FIG. 2 shows a conventional image-rejection heterodyne receiver 100 suitable for AM demodulation in high noise environments. A low frequency broadcast radio signal is received by antenna 105 and subsequently amplified by amplifier 110 to produce a modulated signal 115. The modulated signal 115 is applied as an input to mixers 120 and mixer 140, for mixing the signal with the first and second demodulating signals 178 and 179, respectively. The output of mixer 120 is applied to phase shifter 130 in series with low pass filter 135. Similarly, the output of mixer 140 is applied to phase shifter 150 in series with low pass filter 155. The output of filter 135 and the output of filter 155 are input to a summer 163, which adds the two signals together and outputs the sum to amplifier 167. The output of amplifier 167 is an intermediate frequency signal suitable for subsequent processing.

The first and second demodulating signals 178 and 179 of the conventional image-rejection heterodyne receiver 100 can be produced in a manner similar to that as shown in FIG. 1. However, the frequency synthesizer 173 is configured to receive a reference timing signal 174 (which can be generated by an external source such as a crystal oscillator) instead of the phase error signal 75 (as shown in the conventional direct conversion receiver of FIG. 1). Frequency synthesizer 173 also receives a frequency control signal 197 and provides a local carrier signal 176 to a generator 177. As above, generator 177 can be an I/Q generator and produce an in-phase signal (the first demodulating signal 178) and a quadrature phase signal (the second demodulating signal 179).

In general, portable radio devices must be designed to properly operate in both low noise and high noise environments. In addition, many such devices (including radio wrist watches) have significant power and size design constraints. A radio watch implementing a conventional direct conversion receiver may operate at lower power and have a smaller footprint than a conventional image-rejection heterodyne receiver. However, the device's performance will suffer in a high noise environment. Those radio watches implementing a conventional image-rejection heterodyne receiver will have better performance in a high noise environment, but may be larger than would be desired in some commercial applications. Furthermore, when operating in a low noise environment, a radio watch that includes a conventional image-rejection heterodyne receiver may also consume more power than desired.

Therefore, a need exists for an AM receiver that can combine advantageous properties of both direct conversion and image-rejection heterodyne architectures.

SUMMARY OF THE INVENTION

Embodiments of the present invention relate to apparatuses and methods for receiving an amplitude modulated signal by either direct conversion to baseband or image-rejection heterodyne conversion to an intermediate frequency.

In one aspect, the invention concerns an apparatus for receiving an amplitude modulated signal that can include: a first circuit configured to receive the amplitude modulated signal and a first demodulating signal and provide a first converted signal; a second circuit configured to receive the amplitude modulated signal and a second demodulating signal and provide a second converted signal; a configurable combining element configured to receive the first and the second converted signals and provide an output signal, wherein the output signal corresponds to (i) the first converted signal in a first operating mode and (ii) a combination of the first and the second converted signals in a second operating mode; and a configurable signal generator configured to receive an output from the second circuit and a reference timing signal and provide the first and the second demodulating signals, wherein the first and the second demodulating signals correspond to (i) the output from the second circuit in the first operating mode and (ii) the reference timing signal in the second operating mode.

In another aspect, the invention concerns a method of demodulating an amplitude modulated signal that can include: mixing the amplitude modulated signal with a first demodulating signal to produce a first converted signal; mixing the amplitude modulated signal with a second demodulating signal to produce a second converted signal; combining the first and the second converted signals to produce a third converted signal; and providing the first converted signal to a signal processor in a first operating mode and the third converted signal to the signal processor in a second operating mode, wherein the first operating mode is selected when the first converted signal has a signal to noise ratio above a threshold ratio and the second operating mode is selected when the first converted signal has a signal to noise ratio below the threshold ratio.

In yet another aspect, the invention concerns a method of demodulating an amplitude modulated signal that can include: receiving the amplitude modulated signal; demodulating the amplitude modulated signal by direct conversion to produce a baseband signal; characterizing a parameter of the baseband signal as having a value relative to a threshold value; and demodulating the amplitude modulated signal by heterodyne conversion to an intermediate frequency signal when the parameter of the baseband signal is in a predetermined state relative to the threshold value.

The present invention advantageously provides an efficient and economical approach of converting an amplitude modulated signal to either a baseband signal in a low noise environment or to an intermediate frequency signal in a high noise environment. Specifically, the present invention provides an apparatus operable in a direct conversion mode or an image-rejection heterodyne conversion mode without the use of duplicative hardware.

These and other advantages of the present invention will become readily apparent from the detailed description of preferred embodiments below.

BRIEF DESCRIPTION OF THE DRAWINGS

FIG. 1 is a diagram showing a conventional direct conversion receiver.

FIG. 2 is a diagram showing a conventional image-rejection heterodyne receiver.

FIG. 7 is a diagram showing an exemplary method of demodulating a radio signal using a dual mode receiver in accordance with the present invention.

DETAILED DESCRIPTION OF THE PREFERRED EMBODIMENTS

Figure 3A:
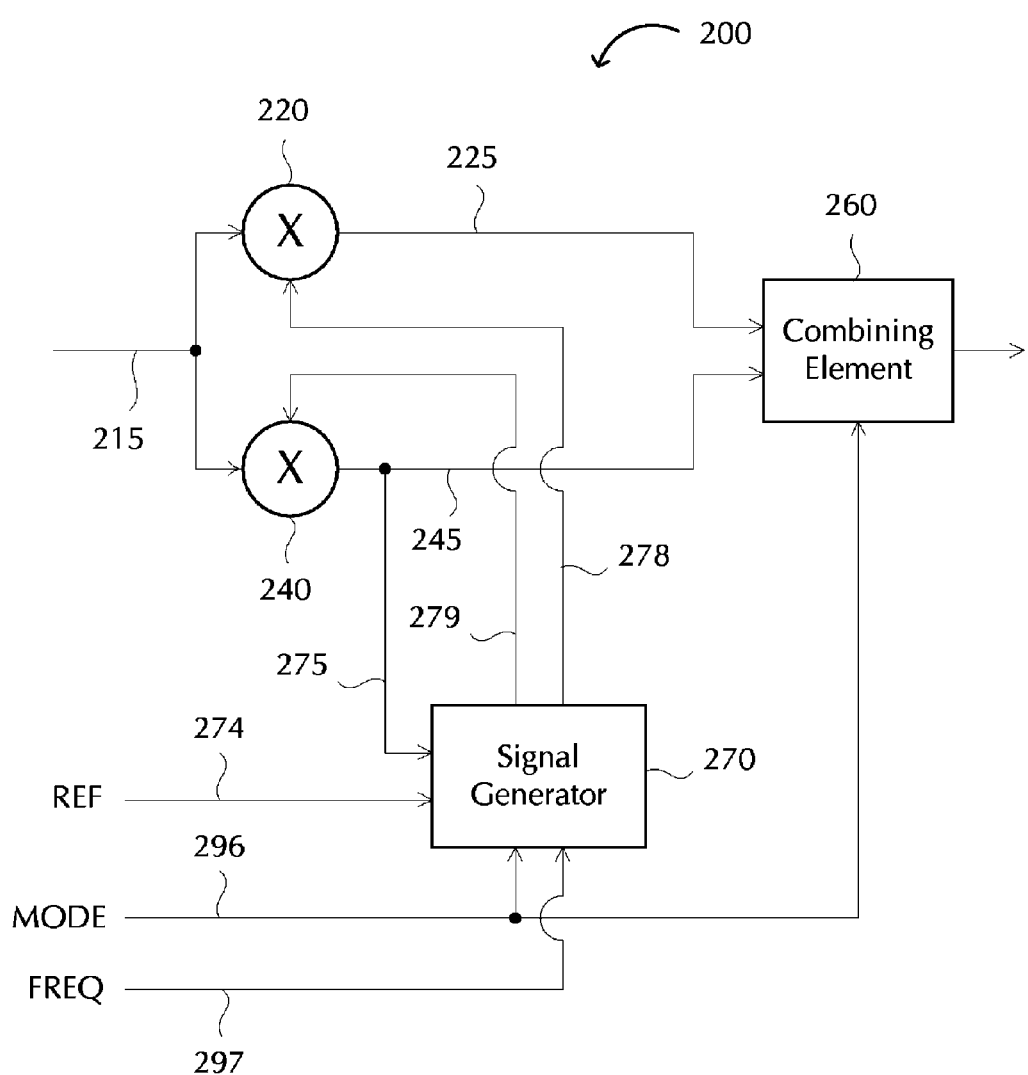
FIG. 3A is a diagram showing an implementation of a dual mode receiver in accordance with the present invention.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

For convenience and simplicity, the terms "data," "signal," and "signals" may be used interchangeably, but these terms are also generally given their art-recognized meanings. Also, for convenience and simplicity, the terms "computing," "calculating," "determining," "processing," "manipulating," "transforming," "operating," and "setting" (or the like) may be used interchangeably, and generally refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture. Similarly, the terms "combined," "summed," "mixed" and the like can be used interchangeably, but are generally given their art-recognized meanings.

The invention, in its various aspects, will be explained in greater detail below with regard to exemplary embodiments.

An Exemplary Apparatus for Receiving an Amplitude Modulated Signal

In one embodiment, an apparatus for receiving an amplitude modulated signal can include: a first circuit configured to receive the amplitude modulated signal and a first demodulating signal and provide a first converted signal; a second circuit configured to receive the amplitude modulated signal and a second demodulating signal and provide a second converted signal; a configurable combining element configured to receive the first and the second converted signals and provide an output signal, wherein the output signal corresponds to (i) the first converted signal in a first operating mode and (ii) a combination of the first and the second converted signals in a second operating mode; and a configurable signal generator configured to receive an output from the second circuit and a reference timing signal and provide the first and the second demodulating signals, wherein the first and the second demodulating signals correspond to (i) the output from the second circuit in the first operating mode and (ii) the reference timing signal in the second operating mode.

In accordance with embodiments of the present invention, the apparatus for receiving an amplitude modulated signal is operable in two modes: direct conversion and image-rejection heterodyne mode. In the discussion that follows, it should be clear that the first operating mode refers to a state wherein the apparatus for receiving an amplitude modulated signal is configured to operate in direct conversion mode to produce a baseband output signal. The second operation mode refers to a state wherein the apparatus for receiving an amplitude modulated signal is configured to operate in image-rejection heterodyne mode to produce an intermediate frequency output signal.

FIG. 3A is an exemplary diagram of one embodiment of the present apparatus 200. A modulated signal 215, similar to signals 15 and 115 in FIGS. 1 and 2, can be received by mixers 220 and 240. Thus, in one embodiment, apparatus 200 may further include an antenna and amplifier configured to provide the modulated signal 215 from a radio signal received by the antenna. Mixer 220 can be configured to mix the modulated signal 215 with a first demodulating signal 278 to produce a first converted signal 225. The first converted signal 225 may be equal to the product of the modulated signal 215 and the first demodulating signal 278. Mixer 240 can be configured to receive the modulated signal 215 and a second demodulating signal 279 and produce a second converted signal 245 which can be equal to the product of the modulated signal 215 and the second demodulating signal 279. As for the conventional receivers described above, signal generator 270 may comprise a frequency synthesizer and a generator. The generator may comprise an I/Q generator for producing the first demodulating signal 278 (e.g., an in-phase clock signal) and the second demodulating signal 279 (e.g., a quadrature phase clock signal).

Combining element 260 can be configured to receive the first converted signal 225 from mixer 220, the second converted signal 245 from mixer 240, and a mode control signal 296 and to provide an output representative of a combination of the first and second converted signals 225 and 245. The mode control signal 296 may have two or more states (typically, two states) where each state corresponds to a distinct operating mode. For example, a one bit digital mode control signal 296 may be a logic "0" in a first operating mode and logic "1" in a second operating mode. However, the mode control signal 296 could also be a multi-bit digital signal or an analog signal (e.g., a bias or control voltage or current), depending on the mathematical operation, specific application, and/or design of combining element 260 and signal generator 270. The output of combining element 260 may correspond to the first converted signal 225 from mixer 220 in the first operating mode (i.e., when the control signal is in a first state) and to a combination (e.g., the sum) of the first converted signal 225 from mixer 220 and the second converted signal 245 from mixer 240 in the second operating mode (i.e., when the control signal 296 is in a second state).

The first demodulating signal 278 received by mixer 220 and the second demodulating signal 279 received by mixer 240 can be generated by signal generator 270. Signal generator 270 can be configured to receive an output 275 of mixer 240, a reference timing signal 274, mode control signal 296 and a frequency control signal 297. The output 275 of mixer 240 received by signal generator 270 may be the second converted signal 245, as discussed above, or may be a secondary output signal from mixer 240. The reference timing signal 274 may be provided by a crystal oscillator or some other oscillation circuit and/or source (e.g., a timer circuit). The mode control signal 296 received by signal generator 270 may be the same control signal 296 received by combining element 260 as discussed above. However, combining element 260 and signal generator 270 may receive different mode control signals, depending on the desired and/or allowable complexity of the design. The mode control signal 296 received by signal generator 270 may have two or more states, wherein each state corresponds to a distinct operating mode. For example, a one bit digital mode control signal 296 may be a logic "0" in the first operating mode and logic "1" in a second operating mode. The signal generator 270 may generate the first and second demodulating signals from the output 275 of mixer 240 in the first operating mode (i.e., when the mode control signal is in a first state) and from the reference timing signal 274 in the second operating mode (i.e., when the mode control signal is in a second state). In addition to the mode control signal 296, signal generator 270 can be configured to receive a frequency control signal 297 for further configuring a frequency of the first and second demodulating signals 278 and 279. The frequency control signal 297 received by signal generator 270 can be used to configure various elements within signal generator 270. In one implementation, frequency control signal 297 can configure frequency dividers within signal generator 270. The frequency control signal 297 received by signal generator 270 may have two or more states, wherein each state corresponds to a distinct frequency of first and second demodulating signals 278 and 279. For example, a one bit digital frequency control signal 297 may be a logic "0" corresponding to a first frequency of the first and second demodulating signals 278 and 279 and logic "1" in corresponding to a second frequency of the first and second demodulating signals. As is the case for the control signal 296, the frequency control signal 297 may be a one bit digital signal, a multi-bit digital signal, or an analog signal (such as a bias voltage).

Figure 3B:
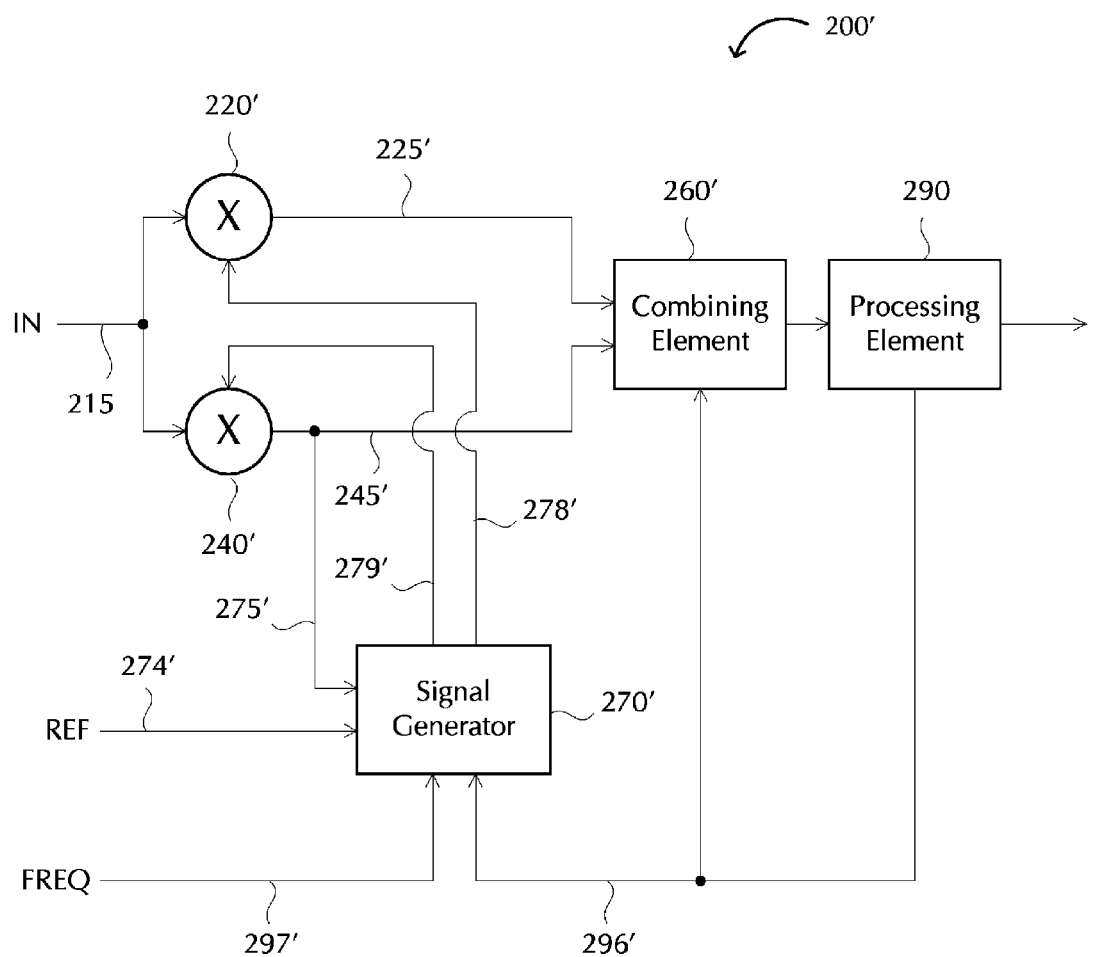
FIG. 3B is a diagram showing another implementation of a dual mode receiver in accordance with the present invention.

The mode control signal 296 that is received by combining element 260 and/or signal generator 270 may be generated from an external source (such as a user configurable switch or button) or from an internal source. In one implementation, and as shown in FIG. 3B, the apparatus may further include a processing element 290 for receiving an output of the combining element 260' and generating a mode control signal 296' having a first value in the first operating mode and a second value in the second operating mode. Processing element 290 may operate on an output of combining element 260' and generate the mode control signal 296' in response thereto. As will be discussed in detail below, in one embodiment, processing element 290 may be configured to determine the signal-to-noise ratio (SNR) of the output signal of combining element 260' and compare it to a threshold SNR. The mode control signal 296' may be a one-bit digital signal, a multi-bit digital signal, or an analog signal. The mode control signal 296' may have two or more states wherein each state corresponds to a distinct operating mode. The mode control signal 296' may have a first value when the output of combining element 260' has a SNR greater than a SNR threshold and a second value when the output of combining element 260' has a SNR less than or equal to the SNR threshold. Otherwise, the circuit blocks and signals of FIG. 3B are substantially the same as for FIG. 3A. Mode control signal 296 and frequency control signal 297, while shown in FIG. 3A as independent signals, may comprise the same signal or signal line (i.e., a multi-conductor line or a single conductor line multiplexed with two different signals thereon).

Figure 4A:
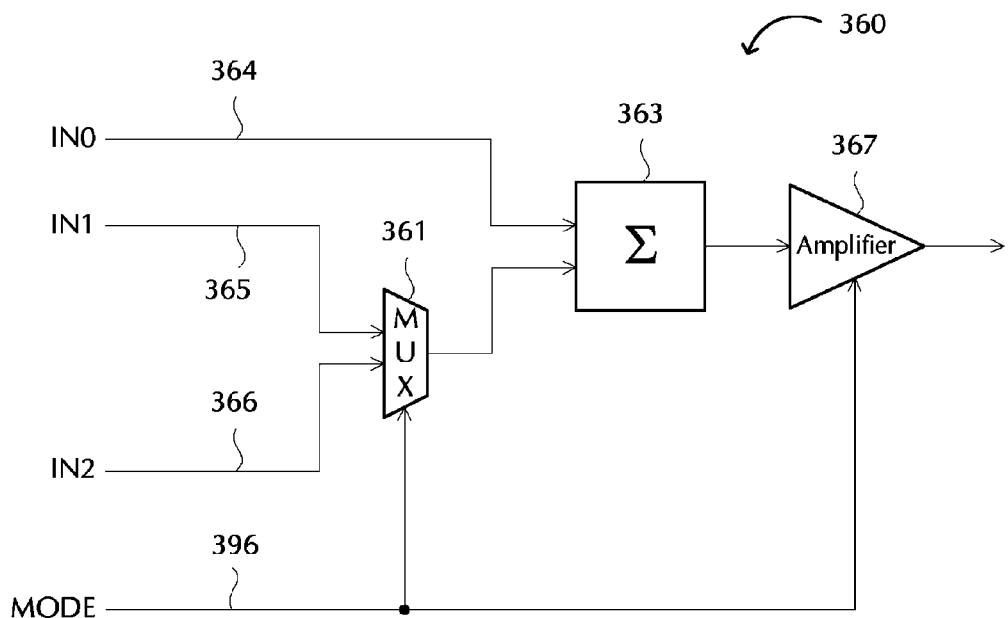
FIGS. 4A-4C are diagrams showing exemplary combining elements in accordance with the present invention.
Figure 4B:
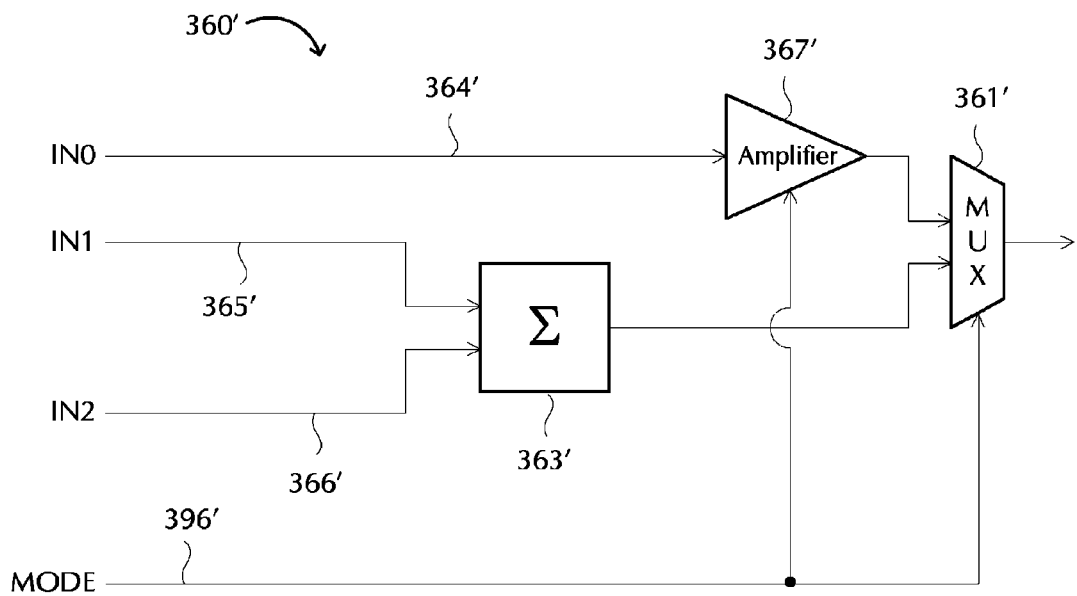
Figure 4C:
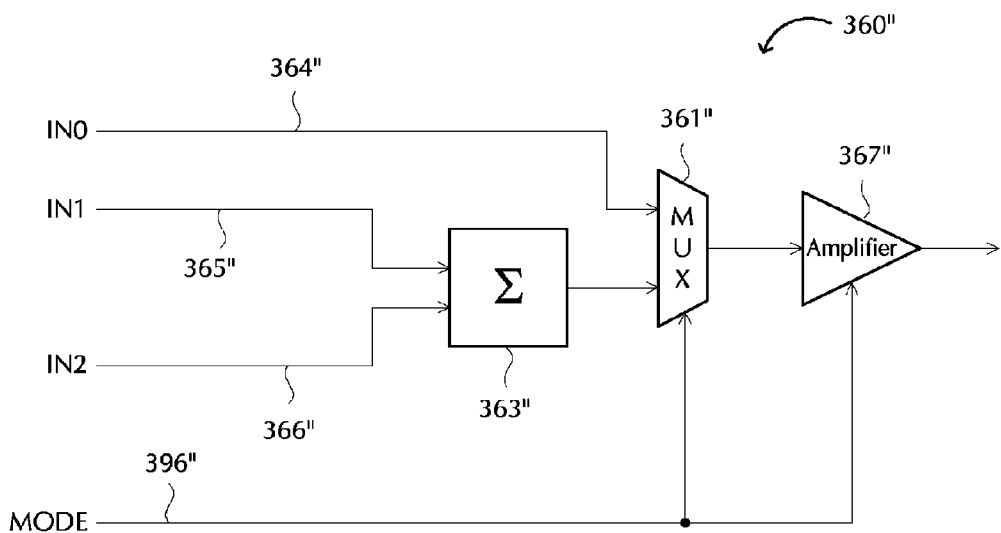

FIGS. 4A-4C are diagrams showing various exemplary implementations of combining elements in accordance with the present invention (for example, combining element 260 in FIG. 3A and/or 260' in FIG. 3B). In each example, the combining element may include one or more multiplexers, summing elements, and/or amplifiers.

In one example, as shown in FIG. 4A, multiplexer 361 can be configured to receive input signals IN1 (at node 365) and IN2 (at node 366) and a mode control signal 396 and produce an output signal equal to the input signal IN1 in a first mode (i.e., when the mode control signal 396 is in a first state) and the input signal IN2 in a second mode (i.e., when the mode control signal 396 is in a second state). Summing element 363 can be configured to receive the output of multiplexer 361 and another input signal IN0 (at node 364) and produce an output signal equal to the sum of the output of the multiplexer 361 and the input signal IN0. For example, the input signal IN0 can be the first converted signal 225 of FIG. 3A, the input signal IN1 can be the second converted signal 245 of FIG. 3A, and the input signal IN2 can be a reference signal. The reference signal IN2 (366) can be a reference voltage (such as ground) or other predetermined voltage or other predefined signal having a known effect on the sum or other mathematical combination of input signals IN0 and IN2. Amplifier 367 can be configured to receive the output of summing element 363 and a mode control signal (396) and produce an output signal equal to a scaled version of the output of summing element 363. Amplifier 367 may have a first gain in a first mode (i.e., when the mode control signal 396 is in a first state) and a second gain in a second mode (i.e., when the mode control signal 396 is in a second state). As for FIGS. 3A-3B, in an alternative embodiment, multiplexer 361 and amplifier 367 may be controlled by separate mode control signals.

In another example, and referring now to FIG. 4B, combining element 360' may include summing element 363' configured to receive first and second input signals IN1 and IN2 at nodes 365' and 366' and produce an output signal equal to the sum of the first and second input signals IN1 and IN2. Amplifier 367' can be configured to produce a scaled version of a third input signal IN0 on node 364'. Multiplexer 361' can be configured to provide one of the output of amplifier 367' and the output of summing element 363', depending on the state of the mode control signal at node 396' (i.e., the output of amplifier 367' is selected when the mode control signal 396' is in a first state, and the output of summing element 363' is selected when the mode control signal 396' is in a second state). Inputs IN0-IN2 are generally the same as in FIG. 4A.

In yet another example, as shown in FIG. 4C, multiplexer 361" can be configured to receive the output of summing element 363" and a third input signal IN0 (node 364"), and amplifier 367" amplifies the output of multiplexer 361". Inputs IN0-IN2 are generally the same as in FIG. 4A. In one implementation, amplifier 367" can be configured to produce a scaled version of the output of summing element 363" when the mode control signal at node 396" configures the circuit elements to operate in image-rejection heterodyne mode (e.g., a direct conversion signal IN0 is selected when the mode control signal 396 is in a first state, and the output of summing element 363" is selected when the mode control signal 396 is in a second state).

Figure 5:
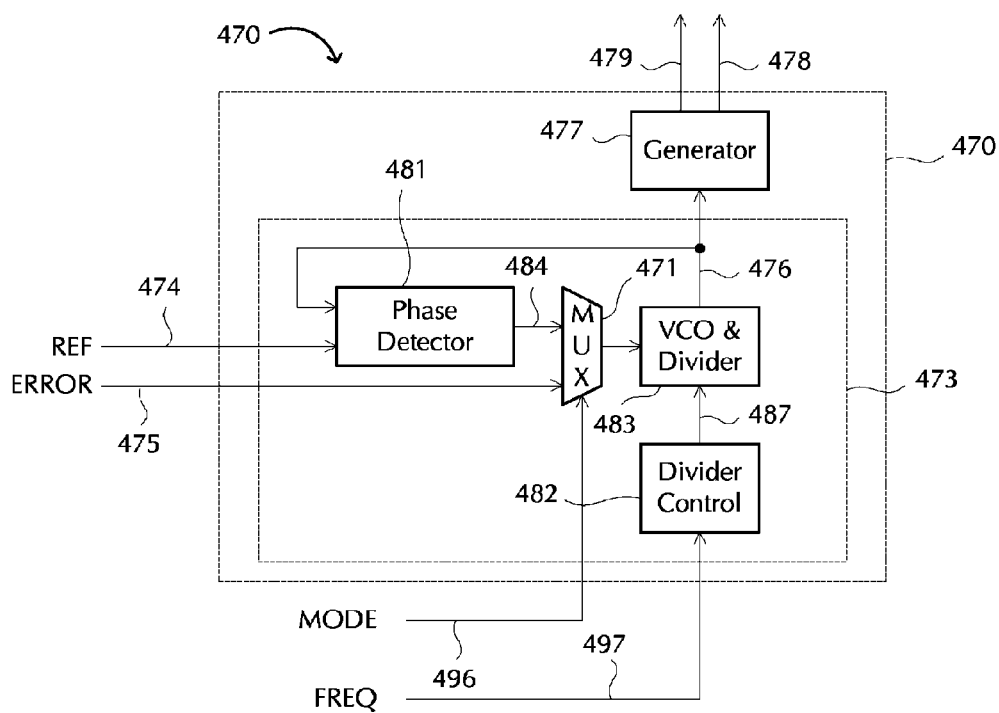
FIG. 5 is a diagram showing an exemplary signal generator in accordance with the present invention.

FIG. 5 is a diagram showing an exemplary implementation of a signal generator in accordance with the present invention (for example, signal generator 270 in FIG. 3A). The signal generator 470 may include a frequency synthesizer 473 and a generator 477 (for example, an I/Q generator as discussed above). In one implementation, frequency synthesizer 473 can include a voltage controlled oscillator (VCO) and frequency divider(s) 483 configured to generate a local carrier signal 476. The frequency divider(s) 483 can have a ratio determined by a frequency control signal FREQ (at node 497). The frequency synthesizer 473 may further include divider control circuitry 482 to receive the frequency control signal FREQ and produce one or more output signals 487 to configure the frequency divider(s) 483. The design of such frequency synthesizers and associated control circuitry are known to those skilled in the art.

The local carrier signal 476 generated by VCO and one or more configurable frequency dividers 483 can be received by a phase detector 481, which can additionally receive a reference timing signal 474 (e.g., reference timing signal 274 of FIG. 3A). An output of phase detector 481 can be provided, along with phase error signal 475 (e.g., the output of mixer 240 of FIG. 3A), as inputs to multiplexer 471. Multiplexer 471 may be configured to select one of an output of phase detector 481 or phase error signal 475 (received at nodes 474 and 475) in response to the state of a mode control signal MODE (received at node 496). The local carrier signal 476 can be received by demodulation signal generator 477 to produce two or more output signals 478 and 479. For example, first and second output signals 478 and 479 can be the first and second demodulating signals 278 and 279 of FIG. 3A, respectively (and may further respectively correspond to an in-phase clock signal and a quadrature phase clock signal, as discussed above). While the frequency control signal FREQ is shown on a separate node 497 from the mode control signal 496, in certain embodiments, the frequency control signal and the mode control signal may be or comprise portions of the same signal.

Figure 6A:
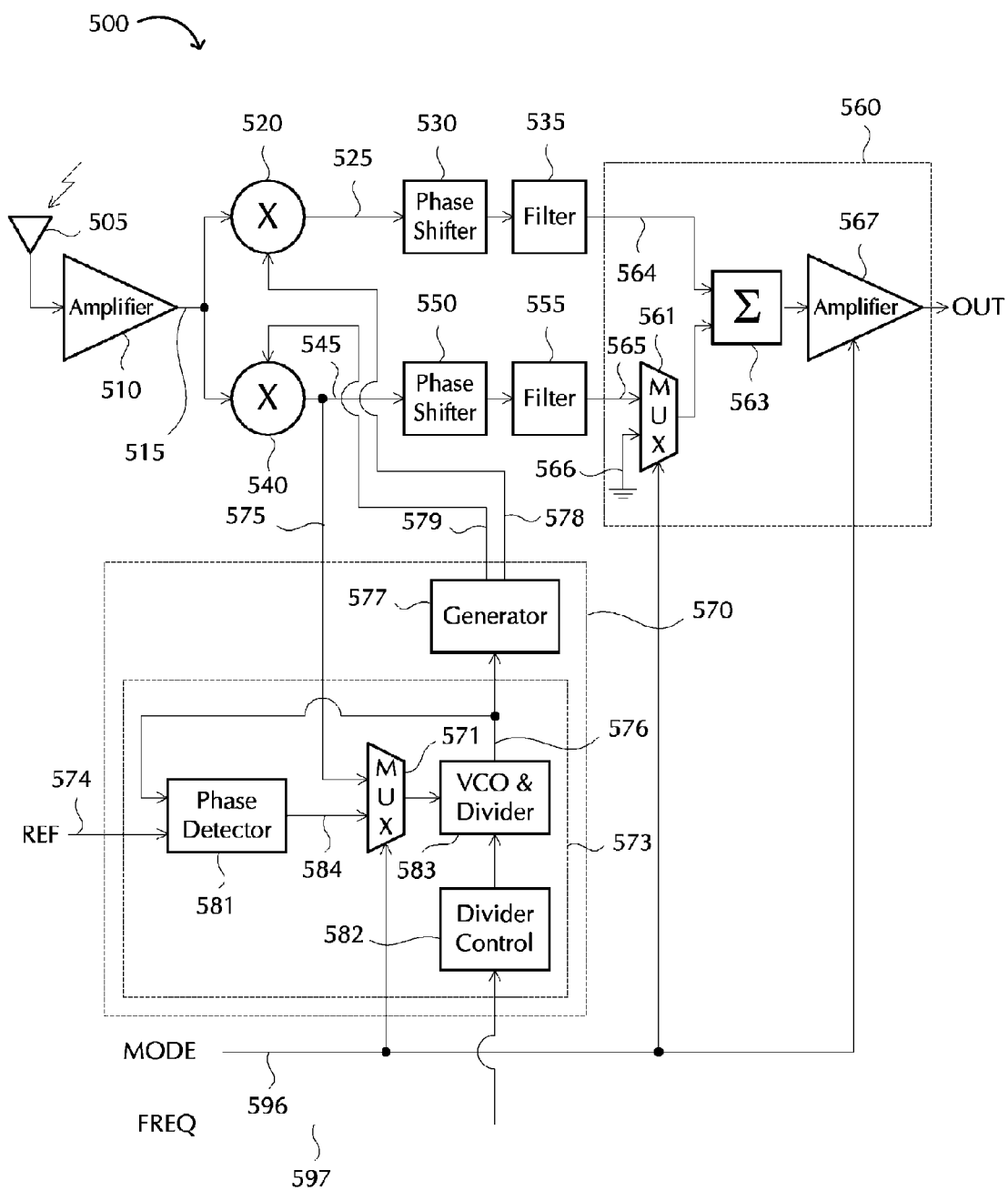
FIG. 6A is another diagram showing an implementation of a dual mode receiver in accordance with the present invention.
Figure 6B:
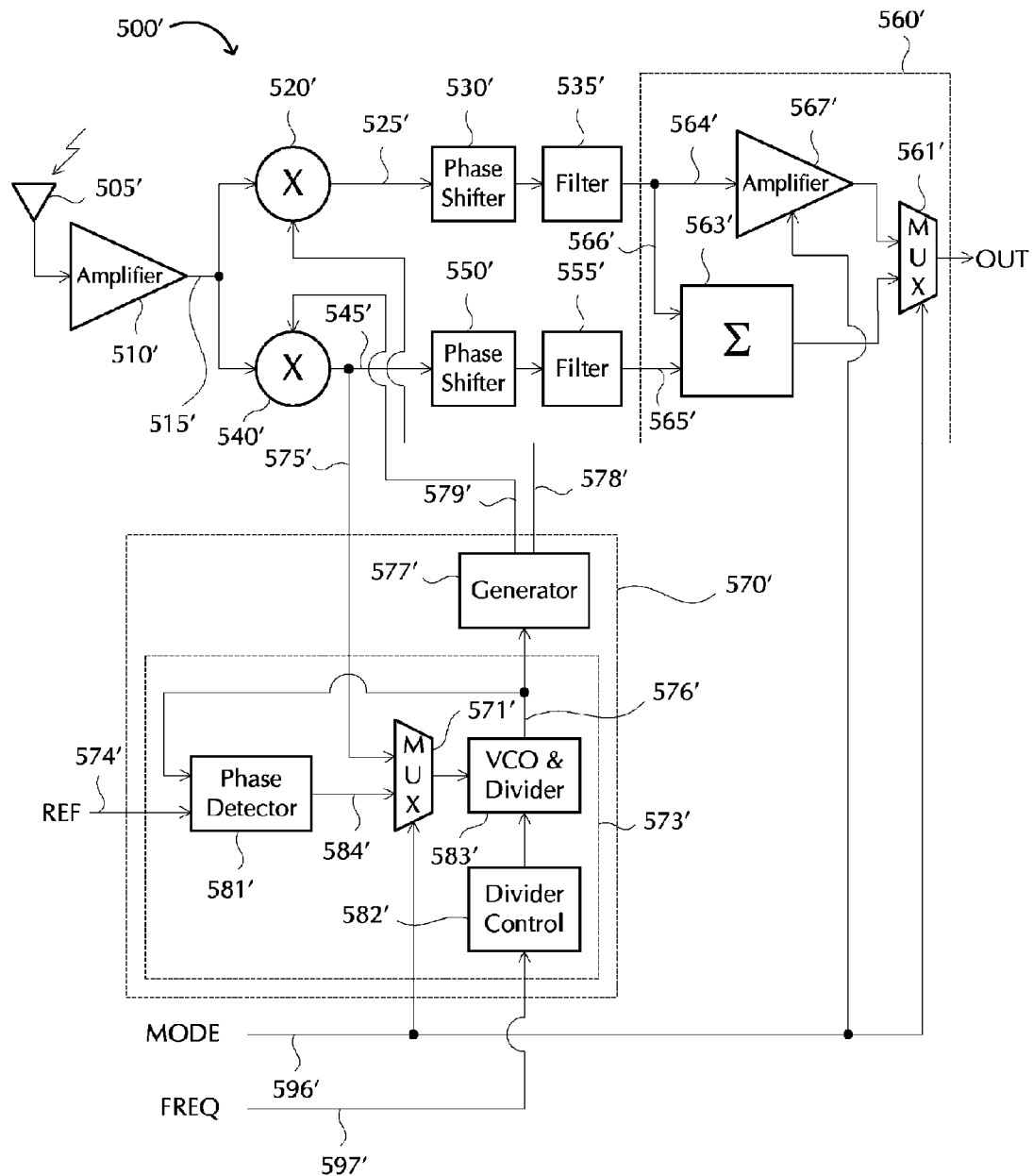
FIG. 6B is another diagram showing another implementation of a dual mode receiver in accordance with the present invention.

FIGS. 6A and 6B are additional exemplary diagrams showing implementations of apparatuses for receiving an amplitude modulated signal according to embodiments of the present invention. A broadcast radio signal can be received by antenna 505 and amplified by amplifier 510 to produce a modulated signal 515. Mixer 520 can be configured to receive the modulated signal 525 and a first demodulating signal 578 and produce a first converted signal 525, which may be equal to the product of the modulated signal 515 and the first demodulating signal 578. Similarly, mixer 540 can be configured to receive the modulated signal 515 and a second demodulating signal 579 and produce a second converted signal 545, which may be equal to the product of the modulated signal 515 and the second demodulating signal 579. In one implementation, the second converted signal may represent a phase error in a first operating mode and a quadrature intermediate frequency signal in a second operating mode. While the foregoing description describes an apparatus 500 for receiving an amplitude shift keyed modulated signal, it is appreciated that additional mixers and demodulating signals may be utilized to produce additional converted signals for more complex modulation schemes.

In one implementation, one or more phase shifters can be configured to produce a phase difference between the first and the second converted signals of about ±π/2 radians. In one example, phase shifter 530 may be configured to shift the phase of the first converted signal 525 by π/4 radians and phase shifter 550 may be configured to shift the phase of the second converted signal 545 by −π/4 radians. In another example, phase shifter 530 may be configured to shift the phase of the first converted signal 525 by π/2 and phase shifter 550 may be configured to shift the phase of the second converted signal 545 by 0. Thus, in an alternative embodiment, only one signal path between a mixer (e.g., 520 or 540) and the summing element (e.g., 563) includes a phase shifter. The design of such phase shifters are known to those skilled in the art.

In certain implementations, a filter 535 may be configured to filter the first converted signal 525 (or a phase shifted version thereof). Filter 535 can be configured such that it eliminates frequencies below a first threshold frequency and/or above a certain threshold frequency (e.g., the frequency of the first demodulating signal 578). For example, filter 535 can be a band pass filter configured to attenuate frequencies below 1 kHz and above 100 kHz. In a further implementation, filter 535 can be a low pass filter configured to attenuate components of the first converted signal having a frequency greater than a threshold frequency. For example, filter 535 can be a low pass filter having a corner frequency of about 100 kHz.

As described above, one implementation of the present invention concerns an apparatus 500 configured to generate a baseband signal in the first operating mode and an intermediate frequency signal in the second operating mode. Therefore, in another implementation, filter 535 may be configured such that the threshold frequency corresponds to a frequency of the first demodulating signal 578 when the apparatus 500 is configured to generate an intermediate frequency signal (e.g., in the second operating mode). It can be appreciated that, when the apparatus 500 is configured to generate a baseband signal, phase shifting the first converted signal 525 with phase shifter 530 and/or filtering the first converted signal 525 (or a phase shifted version thereof) with a low pass filter 535 (having a corner frequency corresponding to a frequency of the first demodulating signal 578 when the apparatus is configured to generate an intermediate frequency signal) has negligible effects on the first converted signal 525.

In addition to phase shifter 530 and filter 535 operable on the first converted signal 525, the apparatus may also include phase shifter 550 and filter 555 operable on the second converted signal 545. While phase shifter 530 and filter 535 are shown as two separate elements, in one example, phase shifter 530 may represent the phase portion of a complex filter and filter 535 may represent the magnitude portion of a complex filter. The design of such complex filters is known to those skilled in the art.

Combining element 560 can be configured to receive the first converted signal 525 from mixer 520 (or a phase-shifted and/or filtered representation thereof 564), the second converted signal 545 from mixer 540 (or a phase-shifted and/or filtered representation thereof 565), and a mode control signal MODE (at node 596) and generate an output signal OUT in response thereto. In one implementation, the output of combining element 560 can be a baseband signal in the first operating mode and an intermediate frequency signal in the second operating mode.

In one implementation, similar to the arrangement shown in FIG. 4A, combining element 560 can include a multiplexer 561 configured to receive a reference signal 566 (e.g., a ground potential) and the second converted signal 545 from mixer 540 (or a phase-shifted and/or filtered representation thereof 565) and provide, to summing element 563, the reference signal 566 in the first operating mode (e.g., when the apparatus 500 is configured to operate in direct conversion mode) and the second converted signal 545 (or phase-shifted and filtered converted signal 565) in the second operating mode (e.g., when the apparatus 500 is configured to operate in image-rejection heterodyne mode). Summing element 563 can be configured to receive the first converted signal 525 from mixer 520 (or a phase-shifted and filtered representation thereof 564) and an output of multiplexer 561 and produce an output equal to the sum of the first converted signal 525 from mixer 520 (or representation thereof 564) and the output of multiplexer 561. In one implementation, amplifier 567 can be configured by the mode control signal 596 to have a first gain in the first operating mode (e.g., when the apparatus 500 is configured to operate in direct conversion mode) and a second gain in the second operating mode (e.g., when the apparatus 500 is configured to operate in image-rejection heterodyne mode). In a further implementation, the first gain may be about D times that of the second gain, where D is an integer from 2 to 8. For example, the amplifier may have a gain of six in the first operating mode and a gain of three in the second operating mode.

In another example, and as shown in FIG. 6B, amplifier 567' can be configured to receive the first converted signal 525' from mixer 520' (or a phase-shifted and/or filtered representation thereof 564') and amplify it with a first gain in a first operating mode and a second gain in a second operating mode. Summing element 563' can be configured to receive the first converted signal 525' from mixer 520' (or phase-shifted and filtered representation thereof 566') and the second converted signal 545' from mixer 540' (or a phase-shifted and/or filtered representation thereof 565') and produce an output equal to their sum. In the implementation of FIG. 6B, multiplexer 561' can be configured to receive the output of amplifier 567' and the output of summing element 563', and provide the output of amplifier 567' as the output of circuit 500' OUT in the first operating mode and the output of summing element 563' as the output OUT in the second operating mode. Other than combining element 560', the circuit 500' is essentially the same as circuit/apparatus 500 of FIG. 6A.

Referring back to FIG. 6A, signal generator 570 can receive a reference timing signal 574, an output 575 of mixer 540, and mode and frequency control signals MODE and FREQ (at nodes 596 and 597, respectively) and generate the first and second demodulating signals 578 and 579. Signal generator 570 can include frequency synthesizer 573 and generator 577 (for example, an I/Q generator as discussed above). In one implementation, multiplexer 571 can be configured to receive an output 575 from the second mixer 540 and a representation of reference timing signal 584 and provide an input to a variable controlled oscillator 583 corresponding to the output 575 from the second mixer 540 in the first operating mode (e.g., a phase error signal) and the representation of the reference timing signal 584 in the second operating mode. In one implementation, a phase detector 581 may be configured to receive a local carrier signal 576 and the reference timing signal 574 and provide the representation of the reference timing signal 584 corresponding to a phase difference between the reference timing signal 574 and said local carrier signal 576. The output 575 from the second mixer 540 may be the second converted signal 545 or it may be a secondary output signal. In certain implementations, frequency synthesizer 573 can be configured to provide a local carrier signal 576 having a first frequency in the first operating mode (e.g., when the apparatus 500 is configured to operate in direct conversion mode) and a second frequency in the second operating mode (e.g., when the apparatus 500 is configured to operate in image-rejection heterodyne mode). For example, the local carrier signal 576 may have a frequency of 60 kHz in the first operating mode and 100 kHz in the second operating mode. Generator 577 can be configured to receive the local carrier signal 576 from frequency synthesizer 573 and provide the first and the second demodulating signals 578 and 579. In a typical implementation, the first demodulating signal 578 is an in-phase demodulating signal and the second demodulating signal 579 is a quadrature phase demodulating signal. Although one example of generator 577 can be an I/Q generator, generator 577 can be configured to provide any number of demodulating signals. The designs of such generators are known to those skilled in the art.

From the above description, the apparatus 500 for receiving an amplitude modulated signal in accordance with one embodiment of the invention is operable in a first operating mode (direct conversion) and a second operating mode (image-rejection heterodyne conversion). A mode control signal (e.g., MODE) can configure one or more multiplexers, amplifiers, and/or frequency synthesizers to operate in either the first or second operating mode. For example, in the first operating mode, multiplexer 561 can be configured to provide the reference signal 566 (e.g., signal ground as shown), amplifier 567 can be configured to provide a first gain equal to at least two times a second gain, multiplexer 571 can be configured to provide an output 575 from mixer 540, and frequency synthesizer 573 can be configured to provide a local carrier signal 576 having a first frequency. In the second operating mode, multiplexer 561 can be configured to provide the second converted signal 545 from mixer 540 (or a representation thereof 565), amplifier 567 can be configured to provide the second gain, multiplexer 571 can be configured to provide a reference timing signal 574, and frequency synthesizer 573 can be configured to provide a local carrier signal 576 having a second frequency. The mode control signal MODE and the frequency control signal FREQ may be the same control signal or they may be independent signals (as shown in FIGS. 6A-6B). For example, while the mode control signal 596 has at least two states (corresponding to the two operating modes), it may be desirable for the frequency control signal 597 to have a larger minimum number of states (corresponding to not only the two operating modes, but to the number of broadcast radio signal frequencies that the apparatus 500 is designed to receive). In one example, the apparatus 500 of the present invention could be included in a radio watch that can receive broadcast radio signals at 40 kHz, 60 kHz, 68.5 kHz, and 77.5 kHz. As such, the frequency control signal 597 may have at least 8 states: four corresponding to direct conversion (i.e., the first operating mode) of each of the broadcast radio signal frequencies and four corresponding to heterodyne conversion (i.e., the second operating mode) of each of the broadcast radio signal frequencies.

An Exemplary Method of Demodulating an Amplitude Modulated Signal

In another embodiment, a method of demodulating an amplitude modulated signal can include mixing the modulated signal with a first demodulating signal to produce a first converted signal, mixing the amplitude modulated signal with a second demodulating signal to produce a second converted signal, combining the first and the second converted signals to produce a third converted signal, and providing the first converted signal to a signal processor in a first operating mode and the third converted signal to the signal processor in a second operating mode, wherein the first operating mode is selected when the first converted signal has a signal to noise ratio greater than a threshold ratio and the second operating mode is selected when the first converted signal has a signal to noise ratio less than or equal to the threshold ratio.

Referring now to FIG. 7, the method can start 610 by receiving a modulated signal. The modulated signal can be mixed with a first demodulating signal to produce a first converted signal in step 620. The first converted signal can be characterized as having a parameter greater than a threshold value or less than or equal to the threshold value in step 630. In one example, the parameter can be a signal to noise ratio. In another example, the parameter can be an average amplitude value of the first converted signal. The threshold value may be predetermined, or, may be determined on-the-fly. If the value of the parameter is characterized as being greater than a threshold value, the first operating mode applies at step 640. If not, the second operating mode applies at step 660. If the first operating mode applies, the first converted signal is provided to a signal processor in step 650 and the method ends 695. If the second operating mode applies, the modulated signal is mixed with a second demodulating signal to produce a second converted signal, as shown in step 670. Next, the first and second converted signals are combined to produce a third converted signal in step 680. The third converted signal is provided to a signal processor in step 690 and the method ends 695.

In one example, the first converted signal can be provided to the signal processor in the first operating mode by adding the first converted signal with a reference signal (such as signal ground) as shown in FIG. 6A. The third converted signal (a combination of the first and the second converted signal) can be provided to the signal processor in a second operating mode by adding the first and the second converted signals. In another example, and as shown in FIG. 6B, the first converted signal can be provided to the signal processor in a first operating mode. The third converted signal can be provided to the signal processor in a second operating mode by adding the first converted signal and the second converted signal.

In another implementation, the method may further include shifting the phase of the first and/or second converted signals such that a phase difference of about $\pm\pi/2$ radians between the signals results. For example, the phase of the first converted signal may be shifted by about $\pi/4$ radians and the phase of the second converted signal may be shifted by about $-\pi/4$ radians. In a further implementation, one of the first and second converted signals may be phase shifted by about $\pm\pi/2$ radians.

In yet another implementation, the method may further include filtering the first converted signal with a low pass filter, wherein the low pass filter attenuates components of the first converted signal having a frequency greater than a threshold frequency corresponding to a frequency of the first and second demodulating signals. For example, if the first and second demodulating signals have a frequency of 100 kHz, the first converted signal may be filtered with a low pass filter having a cutoff frequency of 100 kHz.

In another example, a processing element as shown in FIG. 3B can receive the first converted signal or the third converted signal (a combination of the first converted signal and the second converted signal) and generate a control signal. The control signal can be selected to have a first value if the first converted signal has a signal to noise ratio greater than a threshold value or a second value if the signal to noise ratio has a signal to noise ratio less than or equal to a threshold value. The threshold value may be preconfigured or may be configurable on-the-fly.

In one implementation, the method may further include amplifying the first converted signal by a first gain. For example, and as shown in FIG. 6B, the first converted signal may be amplified by a gain of two. In a further implementation, the method may further comprise amplifying said third converted signal by a second gain. In yet a further implementation, the first gain is about W times that of said second gain, where W is an integer of from 2 to 8. For example, and referring now to FIG. 6A, the first converted signal may be amplified by a first gain and the third converted signal (a combination of the first converted signal and the second converted signal) may be amplified by a second gain. In one example, the first gain can be six and the second gain can be 3. In another implementation, the method may further include amplifying the third converted signal by a third gain, for example, a gain of ½.

In another implementation, the method may further include generating the first and second demodulating signals corresponding to the second converted signal in said first operating mode and a reference timing signal in said second operating mode. For example, a signal generator may receive a reference timing signal and the second converted signal and be configured to generate the first and second demodulating signals in response to either signal.

Another Exemplary Method of Demodulating an Amplitude Modulated Signal

In yet another embodiment, a method of demodulating an amplitude modulated signal can include receiving the amplitude modulated signal, demodulating the amplitude modulated signal by direct conversion to produce a baseband signal. characterizing a parameter of the baseband signal as having a value relative to a threshold value, and demodulating the amplitude modulated signal by heterodyne conversion to an intermediate frequency signal when the parameter of the baseband signal is in a predetermined state relative to the threshold value. In one implementation, the parameter can be a signal to noise ratio of the baseband signal. In a further implementation, the predetermined state can include the signal to noise ratio of the baseband signal being less than or equal to the threshold value.

Figure 8:
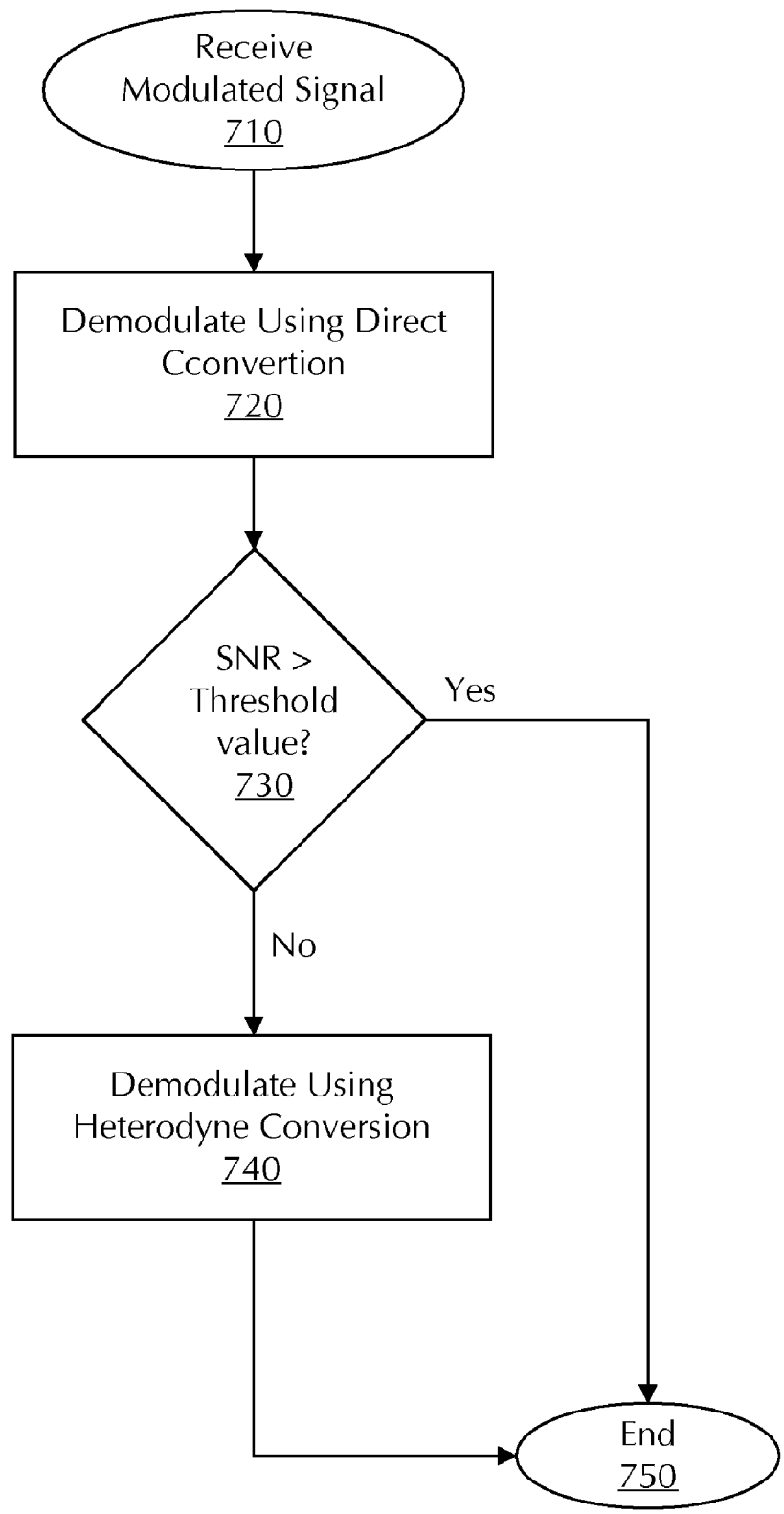
FIG. 8 is a diagram showing another exemplary method of demodulating a radio signal using a dual mode receiver in accordance with the present invention.

Referring now to FIG. 8, the method can start 710 by receiving a modulated signal. The receiver can then be configured to demodulate using direct conversion in step 720. An output signal can be characterized as having a parameter greater than a threshold value or less than or equal to the threshold value. In one example, the parameter can be a signal to noise ratio. In another example, the parameter can be an average amplitude value of the output. The threshold value may be predetermined, or, may be determined on-the-fly. As shown in step 730, if the output signal is characterized as having a SNR greater than the threshold value, the method ends at step 750. If the output signal is characterized as having a SNR not greater than the threshold value, the receiver can then be configured to demodulate using heterodyne conversion in step 740. The method then ends at step 750.

In one implementation, direct conversion can include: configuring a signal generator to generate a first and a second demodulating signal corresponding to the amplitude modulated signal mixed with the second demodulating signal; configuring a combining element to combine the amplitude modulated signal mixed with the first demodulating signal and a reference voltage signal; and configuring an amplifier to amplify with a first gain. In a further implementation, the reference voltage signal can be about zero volts.

In another implementation, heterodyne conversion can include: configuring a signal generator to generate a first and a second demodulating signal corresponding to a reference timing signal; configuring a combining element to combine the amplitude modulated signal mixed with the first demodulating signal and the amplitude modulated signal mixed with the second demodulating signal; and configuring an amplifier to amplify with a second gain.

In another implementation, the method can include configuring a configurable amplifier to amplify with a first gain when demodulating the amplitude modulated signal by direct conversion and a second gain when demodulating the amplitude modulated signal by heterodyne conversion, wherein the first gain can be about V times the second gain, where V is an integer from 2 to 8. Variations on either method of demodulating an amplitude modulated signal can be performed in accordance with descriptions of the operation of the circuitry and/or apparatuses of FIGS. 3A-6B above.

CONCLUSION/SUMMARY

Thus, the present invention provides apparatuses and methods which can efficiently and economically receive an amplitude modulated signal.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An apparatus for receiving an amplitude modulated signal, comprising:
   a) a first circuit configured to receive said amplitude modulated signal and a first demodulating signal and provide a first converted signal;
   b) second circuit configured to receive said amplitude modulated signal and a second demodulating signal and provide a second converted signal;
   c) a combining element configured to receive said first and said second converted signals and provide an output signal, wherein said output signal corresponds to (i) said first converted signal in a first operating mode and (ii) a combination of said first and said second converted signals in a second operating mode; and
   d) a configurable signal generator configured to receive an output from said second circuit and a reference timing signal and provide said first and said second demodulating signals, wherein said first and said second demodulating signals correspond to (i) said output from said second circuit in said first operating mode and (ii) said reference timing signal in said second operating mode.

2. The apparatus of claim 1, wherein said output signal of said combining element comprises (i) a baseband signal in said first operating mode and (ii) an intermediate frequency signal in said second operating mode.

3. The apparatus of claim 1, wherein said second converted signal is a phase error signal in said first operating mode and a quadrature intermediate frequency signal in said second operating mode.

4. The apparatus of claim 1, further comprising one or more phase shifters configured to receive said first and/or said second converted signals and produce a phase difference between said first and said second converted signals of about $\pm\pi/2$ radians.

5. The apparatus of claim 1, wherein one of said first and second circuits comprises a phase shifter for creating a phase difference of $\pm\pi/2$ radians between said first and second converted signals.

6. The apparatus of claim 1, wherein said first and second circuits each comprise a phase shifter configured to shift the phase of said respective first and second converted signals by about $\pm\pi/4$ radians, resulting in the phase difference between said first and said second converted signals of about $\pm\pi/2$ radians.

7. The apparatus of claim 1, wherein said first circuit comprises a first filter.

8. The apparatus of claim 7, wherein said first filter comprises a low pass filter configured to attenuate components of said first converted signal having a frequency greater than a threshold frequency.

9. The apparatus of claim 8, wherein said threshold frequency corresponds to a frequency of said first and said second demodulating signals in said second operating mode.

10. The apparatus of claim 1, wherein said combining element comprises a multiplexer configured to receive a reference signal and said second converted signal and provide (i) said reference signal in said first operating mode and (ii) said second converted signal in said second operating mode.

11. The apparatus of claim 1, wherein said combining element comprises a multiplexer configured to receive said first converted signal and said combination of said first and said second converted signals and provide (i) said first converted signal in said first operating mode and (ii) said combination of said first and said second converted signals in said second operating mode.

12. The apparatus of claim 1, wherein said combining element comprises a configurable amplifier, wherein said configurable amplifier has (i) a first gain in said first operating mode and (ii) a second gain in said second operating mode.

13. The apparatus of claim 12, wherein said first gain is about D times that of said second gain, where D is an integer of from 2 to 8.

14. The apparatus of claim 1, wherein said configurable signal generator comprises a configurable frequency synthesizer configured to provide a local carrier signal having (i) a first frequency in said first operating mode and (ii) a second frequency in said second operating mode.

15. The apparatus of claim 14, wherein said configurable frequency synthesizer comprises a voltage controlled oscillator and one or more configurable frequency dividers configured to produce said local carrier signal, wherein said one or more configurable frequency dividers have a ratio configured in response to a control signal.

16. The apparatus of claim 15, wherein said configurable frequency synthesizer further comprises a multiplexer configured to receive said output from said second circuit and a representation of said reference timing signal and provide an input to said variable controlled oscillator, wherein said input to said variable controlled oscillator corresponds to (i) said output from said second circuit in said first operating mode and (ii) said representation of said reference timing signal in said second operating mode.

17. The apparatus of claim 16, wherein said configurable frequency synthesizer further comprises a phase detector configured to receive said local carrier signal and said reference timing signal and provide said representation of said reference timing signal, wherein said representation of said reference timing signal corresponds to a phase difference between said reference timing signal and said local carrier signal.

18. The apparatus of claim 14, wherein said configurable signal generator further comprises a quadrature phase signal generator configured to receive said local carrier signal and provide said first and said second demodulating signals, wherein said first demodulating signal is an in-phase signal and said second demodulating signal is a quadrature phase signal.

19. The apparatus of claim 1, further comprising a processing element for receiving said output signal of said combining element and generating a control signal, wherein said control signal has (i) a first value in said first operating mode and (ii) a second value in said second operating mode.

20. A method of demodulating an amplitude modulated signal, comprising:
a) mixing said amplitude modulated signal with a first demodulating signal to produce a first converted signal;
b) mixing said amplitude modulated signal with a second demodulating signal to produce a second converted signal;
c) combining said first and said second converted signals to produce a third converted signal; and
d) providing said first converted signal to a signal processor in a first operating mode and said third converted signal to said signal processor in a second operating mode, wherein said first operating mode is selected when said first converted signal has a signal to noise ratio greater than a threshold ratio and said second operating mode is selected when said first converted signal has a signal to noise ratio less than or equal to said threshold ratio.

21. The method of claim 20, further comprising generating said first and said second demodulating signals corresponding to said second converted signal in said first operating mode and a reference timing signal in said second operating mode.

22. The method of claim 20, further comprising shifting the phase of one of said first and said second converted signals by about $\pm\pi/2$ radians, or shifting the phase of one of said first and said second converted signals by about $\Pi/4$ radians and the other of said first and said second converted signals by about $-\pi/4$ radians.

23. The method of claim 20, wherein said first and said second converted signals have a phase difference of about $\pm\pi/2$ radians.

24. The method of claim 20, further comprising amplifying said first converted signal by a first gain.

25. The method of claim 24, further comprising amplifying said third converted signal by a second gain.

26. The method of claim 25, wherein said first gain is about W times that of said second gain, where W is an integer of from 2 to 8.

27. The method of claim 20, further comprising amplifying said third converted signal by a third gain.

28. The method of claim 20, further comprising filtering said first converted signal with a low pass filter, wherein said low pass filter attenuates components of said first converted signal having a frequency greater than a threshold frequency corresponding to a frequency of said first and said second demodulating signals.

29. A method of demodulating an amplitude modulated signal, comprising:
a) receiving said amplitude modulated signal;
b) demodulating said amplitude modulated signal by direct conversion to produce a baseband signal;
c) characterizing a parameter of said baseband signal as having a value relative to a threshold value; and
d) demodulating said amplitude modulated signal by heterodyne conversion to an intermediate frequency signal when said parameter of said baseband signal is in a predetermined state relative to said threshold value;
wherein said parameter is a signal to noise ratio of said baseband signal.

30. The method of claim 29, wherein said predetermined state comprises said signal to noise ratio of said baseband signal being less than or equal to said threshold value.

31. The method of claim 29, wherein said direct conversion comprises:
a) configuring a configurable signal generator to generate a first and a second demodulating signal corresponding to said amplitude modulated signal mixed with said second demodulating signal;
b) configuring a configurable signal combining element to combine said amplitude modulated signal mixed with said first demodulating signal and a reference voltage signal; and
c) configuring a configurable amplifier to amplify with a first gain.

32. The method of claim 31, wherein said reference voltage signal is about zero volts.

33. The method of claim 29, wherein said heterodyne conversion comprises:
a) configuring a configurable signal generator to generate a first and said second demodulating signal corresponding to a reference timing signal;

b) configuring a configurable signal combining element to combine said amplitude modulated signal mixed with said first demodulating signal and said amplitude modulated signal mixed with said second demodulating signal; and c) configuring a configurable amplifier to amplify with a second gain.

34. The method of claim 29, further comprising configuring a configurable amplifier to amplify with a first gain when demodulating said amplitude modulated signal by said direct conversion and a second gain when demodulating said amplitude modulated signal by said heterodyne conversion, wherein said first gain is about V times said second gain, where V is an integer from 2 to 8.

* * * * *